United States Patent [19]

Dawes et al.

[11] Patent Number: 4,802,532

[45] Date of Patent: Feb. 7, 1989

[54] HEAT SINK

[75] Inventors: Ronald G. Dawes, Tamworth; Geoffrey T. Hilton, Solihull; Anthony W. Marshall; Derek Bullivant, both of Birmingham, all of England

[73] Assignee: British Telecommunications Public Limited Company, United Kingdom

[21] Appl. No.: 27,321

[22] Filed: Jan. 23, 1987

[30] Foreign Application Priority Data

Jan. 24, 1986 [GB] United Kingdom ............... 8601746

[51] Int. Cl.⁴ .............................................. H01L 73/02
[52] U.S. Cl. .................................. 165/80.3; 165/185; 357/81; 361/383
[58] Field of Search ...................... 165/80.3, 80.4, 185; 357/81, 82; 361/381, 382, 383, 386

[56] References Cited

U.S. PATENT DOCUMENTS

| | | | |
|---|---|---|---|
| 3,435,891 | 4/1969 | Parrish | 165/80.3 |
| 3,476,177 | 11/1969 | Potzl | 165/80.3 |
| 4,046,442 | 9/1977 | Hutchinson | 439/72 |
| 4,293,175 | 10/1981 | Cutchaw | 439/72 |
| 4,607,685 | 8/1986 | Mitchell, Jr. | 165/80.3 |
| 4,685,211 | 8/1987 | Hagihara et al. | 165/80.4 |

FOREIGN PATENT DOCUMENTS

| | | |
|---|---|---|
| 0130279 | 9/1985 | European Pat. Off. . |
| 1403579 | 5/1965 | France . |
| 8103734 | 12/1981 | PCT Int'l Appl. . |

Primary Examiner—Ira S. Lazarus
Assistant Examiner—Richard R. Cole
Attorney, Agent, or Firm—Nixon & Vanderhye

[57] ABSTRACT

Low thermal resistance coupling is provided between electronic components and a main heat sink by the expedient of providing individual, adjustable height pillars between them. The pillars (7) comprise a bifurcated body and a detachable head 10. The head is attached to the hot component by means of silver loaded epoxy (8). The height of the pillar may subsequently be adjusted, the component (2) attached to a circuit board, and the pillar secured by establishing an interference fit between the pillar 7 and the walls of its mounting hole. Thermal resistances of less than 6.5° C/W are achieved between a semiconductor junction and a heat sink coupled in this way.

20 Claims, 4 Drawing Sheets

THERMAL CYCLING PROGRAMME

```
COMPONENTS : 128 CELL ARRAY (CODEC II)
PACKAGE    : MSI CERAMIC FLATPACK 4U64CM-2
LEAD FORM  : Z CRIMP
INTERFACE  : SILVER EPOXY
PILLAR     : ADJUSTABLE, LOCKING. (14.4mm DIA.)
```

| CUMULATIVE CYCLES AND TEMPERATURE EXCURSION | $\theta_J/_{HS}$ (°C/W) CELL ARRAY NO. | | | | |
|---|---|---|---|---|---|
| | 1 | 2 | 3 | 4 | 5 |
| −25/+80°C | | | | | |
| 0   | 5.7 | 4.9 | 6.2 | 6.5 | −   |
| 20  | 6.0 | 4.5 | 4.7 | 5.6 | −   |
| 50  | 5.9 | 4.9 | 5.5 | 6.0 | 4.6 |
| 80  | 6.1 | 4.9 | 5.5 | 5.9 | 3.6 |
| 110 | 5.9 | 5.1 | 5.6 | 5.7 | 3.4 |
| −35/+100°C | | | | | |
| 10  | 6.3 | 4.7 | 5.6 | 6.0 | 3.4 |
| 50  | 6.3 | 5.7 | 5.9 | 6.3 | 3.6 |
| 100 | 6.2 | 4.8 | 5.8 | 5.9 | 3.6 |

HEAT SINK

The present invention relates to heat sinks and more particularly to heat sinks for use with electronic components such as integrated circuits.

It is well known that electronic components, in particular semiconductor components, generate heat in operation. Power transistors and diodes may dissipate powers in excess of 100 Watts, and it is known that such components need to be cooled if thermally induced failure is to be avoided. With low circuit board power densities it is possible to use modestly sized heat sinks and natural convection. With greater power densities it is necessary to increase the size of the heatsink and/or use forced air or liquid cooling.

For some time it has been known to provide forced air or liquid cooling for equipment, such as computer equipment, which utilises large numbers of integrated circuits (i.c.s) packaged in a confined space, even though each i.c. only dissipates very low power (<0.1 watt). However forced air and liquid cooling add complexity, and are to be avoided if possible, as they both require the use of moving parts—fans and pumps, which are subject to failure. Liquid cooling is more strenuously avoided, particularly by customers, because it adds considerably to complexity, weight and cost.

The continuing trend towards higher and higher levels of circuit integration now means that individual i.c. packages (hereinafter "chip carriers") now dissipate appreciable power (in excess of 4.5 Watts in some cases), and hence the problems of thermal management can be expected to become more acute, even for systems which use relatively few i.c.s.

The use of forced air or liquid cooling does have certain advantages in that it may not be possible to provide adequate cooling with natural convection without the use of unacceptably large (and heavy) heat sinks. However, in other situations it may be possible to use natural convection with a heat sink of moderate size, provided that the thermal resistance between the hot component and the heat sink can be kept sufficiently low. Indeed in any thermal management situation it is advisable to try to minimise the thermal resistance between the heat generation site (such as the semiconductor junction of a transistor or i.c.) and the surface of the heat sink exposed to the cooling medium (whether air, water or some other fluid). The principal obstacle to be overcome in the search for low thermal resistance is the presence of air gaps, since air is an efficient thermal insulator (the thermal conductivity of air is about $10^{-4}$ that of aluminium), even very small gaps add significantly to the overall thermal resistance. For this reason heat sinking systems which rely on heat transfer via a threaded component are to be avoided: there are always gaps between the male and female components and usually in practice only small parts of the threads of the male and female members provide direct heat transfer. The amount of direct contact between the two members is also disadvantageously unpredictable. The size of air gaps between the component to be cooled and the contact face of the heat sink can be reduced by careful machining of the contact face and by maintaining tight limits on the tolerance on flatness of the mating surface of the component. Even with careful control of these variables, air gaps will remain, but the thermal resistance of the system can be reduced somewhat by means of thermally conductive greases, adhesives or fillers between the contact and mating faces. Problems still arise, however when several hot components are mounted on a single circuit board and are to be cooled by means of a single heat sink. Specifically, the flatness tolerances on the circuit board and heat sink are so great that they make it very difficult to obtain the desired minimum gaps for all the contact/mating face pairs. The current practice of providing pillars on the heat sink, extending through holes in the circuit board to contact the hot components can add to this problem in that instead of the desirable minimum gap, some contact/mating face pairs may have a negative clearance which will tend to push that component off the circuit board, and/or lift the circuit board thereby increasing the gaps of each of the other pairs.

This last problem of coping with different clearances among several hot components mounted on one circuit board has been dealt with by the use of springs.

One such solution is shown in the article by A J Blodgett, entitled "Microelectronic Packaging", Scientific American, July 1983, pp 76-88. In this, a water cooled heat sink is mounted above the circuit board, and spring loaded pistons extend from the heat sink to contact the upper surface of the hot components. The circuit board, hot components, pistons and springs are all located in a closed chamber which is filled with helium to enhance heat transfer from the components to the heat sink (the thermal conductivity of helium is about 10 times that of air). Despite the tremendous complexity of this system, the total thermal resistance from the bare chips (which are not packaged in chip carriers) to the flowing water is still 11° C./Watt per chip site.

An alternative use of spring loading is an attempt to minimise gaps between hot components and heat sinks is that embodied in the 'Flexwell' system of Welwyn Electronics. In that system chip carriers are mounted on a flexible circuit which in turn is mounted between a pair of heat sinks. The lower heat sink is provided with pillars which co-operate with holes in the flexible circuit, providing access to the underside of a chip, carrier for each pillar's contact face. Conical springs extend from the upper heat sink and bear on the upper surfaces of the chip carriers.

The springs accommodate variations in pillar height and chip carrier flatness while still ensuring that the contact and mating surfaces are kept in fairly good thermal contact ("thermal" grease is used between the surfaces to avoid the formation of air gaps). Among the disadvantages of this system are that it requires the use of a flexible circuit (the thinness of which acts to limit the maximum operating speed of circuitry mounted thereon), and the use of two heat sinks. More significantly it uses springs as heat transfer elements—a function for which they are ill suited. Despite the system's relative complexity, and the use of two heat sinks, overall thermal resistance is disappointingly high.

The present invention aims to provide a low thermal resistance arrangement by means of which a hot component may be thermally coupled to a heat sink, while avoiding many of the disadvantages inherent in earlier systems.

According to a first aspect of the present invention there is provided a heat sink for an electronic component, comprising a main heat sinking body; a slug of thermally conductive material slideably received in a hole in said body, the slug having a first contact face for thermal contact with the component; means being provided whereby the clearance between the walls of the slug and the walls of the hole can be reduced to establish an interference fit therebetween to secure the slug in the hole, wherein with said interference fit established the thermal resistance between said first contact face and said main heat sinking body is less than or equal to 5° C. per Watt.

An advantage of such an arrangement is that adjustability can be provided to accommodate components mounted at different distances from the circuit board, without the use of springs and without the need to use threads as interfaces in the heat path. It is possible to provide a heat transfer path between the component and the main heat sink which is effectively free of air gaps, leading to very low thermal resistances.

Preferably the interference fit is provided by expanding the slug laterally within the hole, as this helps to keep the thermal path short, enables the clearance reducing means to be concealed within the slug and avoids, where the slug is fitted within a sleeve pressed into a larger heatsink, generating a force acting to separate the sleeve and heatsink.

According to a second aspect of the present invention there is provided an assembly comprising an electronic component mounted on a substrate; a heat sink comprising a main heat sinking body and a slug of thermally conductive material received within a hole in said body and having a contact face remote from said body for thermal contact with the component; wherein an interference fit exists between the slug and said hole, whereby the slug is retained in said hole; and wherein the thermal resistance between said first contact face and said main heat sinking body is less than or equal to 5° C. per Watt.

Preferably, the thermal resistance between the first contact face and the main heat sink is less than or equal to 3° C. per Watt, and more preferably less than or equal to 1° C. per Watt.

According to a third aspect of the present invention there is provided an assembly comprising a plurality of electronic components mounted on a substrate; a heat sink attached to the substrate and comprising a main heat sinking body and a plurality of slugs of thermally conductive material each received in a respective hole in said body and having a contact face, remote from said body, for thermal contact with one of said components; the contact face end of each of said plurality of slugs extending through said substrate by an adjustable amount, the slugs being lockable in the adjusted position by the establishment of an interference fit between the walls of each of the slugs and their respective holes, wherein with said interference fit established the thermal resistance between said first contact face and said main heat sinking body is less than or equal to 5° C. per Watt.

An embodiment of the present invention will now be described by way of example only, with reference to the accompanying drawings, in which.

Figure 1:
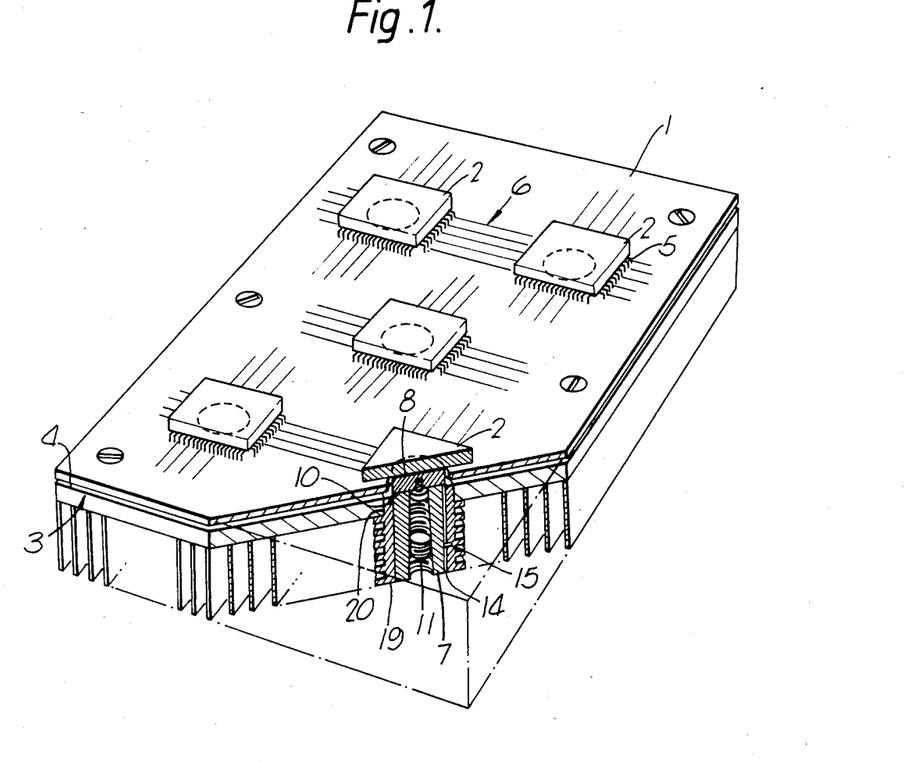
FIG. 1 is a perspective view, part in cross section, of a circuit board and heat sink assembly, showing a heat sink and an assembly according to the present invention.

In FIG. 1 a circuit board 1 carrying ceramic chip carriers 2(2'-2) is securely attached with countersunk screws to a finned plate heat sink 3, with an air gap 4 between. The chip carriers' crimped leads 5 are soldered to the conductive tracks 6 on the surface of the board, securing the chip carriers and providing electrical interconnection. Between the heat sink 3 and the chip carriers 2 extend pillars or slugs 7. The top of each slug is in intimate thermal contact with the underside of a chip carrier. In the example shown, the slugs and chip carriers are bonded together with a thin layer of silver loaded epoxy adhesive 8. Each slug is itself secured within a cylindrical cavity in the heat sink 3. This construction has the advantage that it enables the use of a substantially rigid circuit board, such as conventional glass fibre circuit board laminate.

Figure 2:
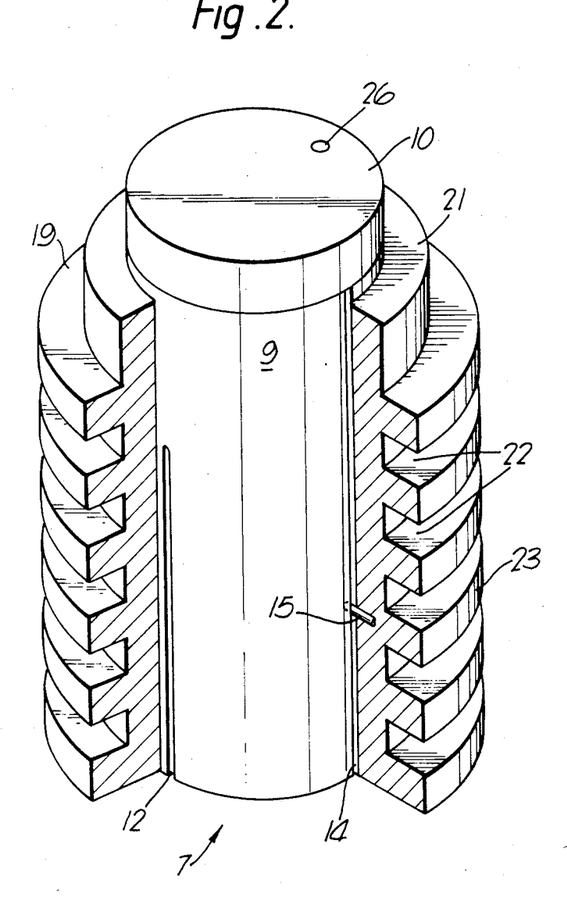
FIG. 2 is a perspective view, part cut away, of the slug and sleeve shown in FIG. 1.
Figure 3:
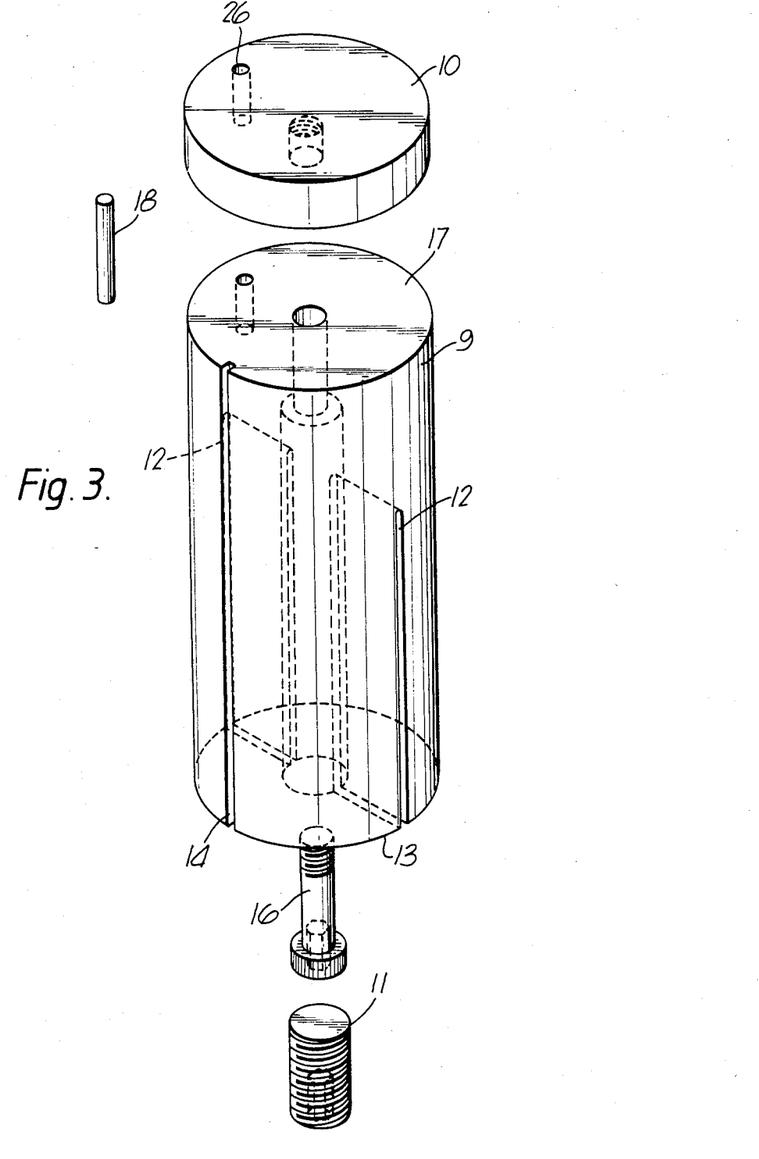
FIG. 3 is an exploded view of the slug of FIG. 2.

The precise relationship between the slug and the main heat sink is best seen by reference to FIGS. 2 and 3. The slug comprises a cylindrical body 9 and a cylindrical head or cap 10 secured thereto. The body is axially bored and tapped to receive a grub screw 11, and is bifurcated by slits 12 from the end 13 remote from the cap for about two thirds of its length. The bore of the body is tapered, so that as the grub screw is screwed in from end 13 the external diameter of the slug increases in the region of the slits 12.

To facilitate tightening of the grub screw 11, the slug has a groove 14 running longitudinally on its outer surface from one end to the other and a co-operating spigot 15 is provided on the wall of the hole in which the slug body is received. The cap 10 is secured to the body by means of a second screw 16, screwed through the head end 17 of the body, in line with the slug's axis. To prevent the cap rotating when the screw 16 is tightened, the body end face 17 is provided with a spigot 18 which co-operates with a corresponding hole 26 in the underside of cap 10. The use of a detachable head enables the body of the slug to be retained in the event that one of the electronic components fails. The defective component, with the cap attached, is discarded and replaced by a new component and cap. A further advantage of the detachable head is that it is possible to measure easily the thermal resistance between the chip carrier and the cap following their bonding but before assembly of the circuit board. If the resistance is found to be too high the assembly is rejected. In our current project the maximum acceptable thermal resistance is 1.2° C./Watt, with a typical tested value of 0.6° C./Watt. With one piece slug, measurement of the relevant chip carrier to slug thermal resistance is much more difficult. With a one-piece slug there is also a greater risk of the chip carrier or the chip carrier to slug bond being damaged in storage.

In order to accommodate any excessive misalignment between the circuit board and the heat sink, it is useful if the screw 16 which secures the cap to the body has a smaller diameter than that of the hole in the end face of the body through which it passes. Such an arrangement affords lateral movement of the cap relative to the body. This facility benefits repair (ie. the replacement of heat sinked components) and is particularly useful during the circuit preproduction phase, allowing the assembly of incorrectly toleranced units. Typically the screw 16 and hole are toleranced to allow a 0.5 mm off-centre cap adjustment. Such a head/body misalignment results in a minimal and normally acceptable increase in thermal resistance, but this can be minimised by having a body of greater diameter than the cap so that the cap is fully supported by the body even when fully offset.

As shown in FIGS. 2 and 3, a generally cylindrical sleeve 19 is used in association with slugs 7. The slug, before being expanded by tightening screw 11, is a sliding fit in the bore of sleeve 19. Sleeve 19 allows the use of slugs 7 with proprietary heat sinks which would otherwise not be thick enough to accommodate and support the slugs. With the sleeve, the heat sink is drilled to provide a suitable hole 20 into which the sleeve is pressed—the sleeve having a suitably sized and toleranced end diameter 21. The remainder of the outer surface of the sleeve may be provided with circumferential grooves 22 to produce fins 23 as shown.

In use the sleeves 19, if used, are pressed into the heat sink, and the heat sink secured to the circuit board. If the caps have not already been bonded to the chip carriers, the slugs are then raised, so that the caps protrude through the circuit board, and locked by tightening screws 11. The chip carriers 2 are then bonded to the slugs with the minimum of silver loaded epoxy. After the epoxy has cured, the slugs are unlocked by releasing screws 11 and the chip carriers lowered into position and soldered to the circuit boards. After allowing the chip carriers and solder to cool, the screws 11 are securely tightened to provide an interference fit between the slugs and the walls of their respective holes so that a low thermal resistance exists between them.

If the circuit board and heat sink are assembled in this way, the amount of stress on the chip carrier/circuit board soldered joints is considerably reduced, which in turn reduces the likelihood of failure in operation due to differential thermal expansion.

By using a fairly long pillar and sleeve (typical dimensions being 14.5 mm diameter and 30 mm length for the pillar body, 5 mm length for the cap and 25 mm length of the sleeve) a significant surface area is made available for heat transfer between the pillar and the sleeve. The value of this approach is shown by the fact that a thermal resistance of less than 1° C./W has been achieved between the pillar and the heat sink, even when a sleeve is used (this thermal resistance is obtained when using a pillar locking torque of less than 5.42 Mm (4 ft. lbs) on the 8 mm grub screw).

Preferably, the assembly is dimensioned such that the area of the interface between the sleeve and the heat sink is greater than that between the slug and the sleeve which in turn is greater than that between the component and the cap, as this tends to minimise the thermal resistance between the component and the main heat-sink.

It is desirable that both the surface of the cap 10 which is to be attached to the chip carrier and the corresponding surface of the chip carrier have a high degree of flatness to minimise the thickness of epoxy or thermally conductive silicone needed between them (although it should be noted that the layer of epoxy or silicone serves to accommodate differential strains resulting from the different temperature coefficients of expansion of the chip and the cap). Preferably the separation between the cap and the chip carrier should be not more than about 0.3 mm.

In order to minimise the effects of strain on the packages it is preferable that the connections between the packages and the circuit be by way of crimped legs, since the crimped legs can accommodate a degree of strain due to differential thermal expansion which might otherwise cause mechanical failure of the package (ceramic chip carriers, preferred because of their good thermal properties, are somewhat sensitive mechanically). We have found that an omega configuration crimp is particularly good in accommodating strain.

Although the embodiments shown in the accompanying figures and described above feature slugs and holes of circular cross section, there is of course no reason why other cross sections should not be used, and terms in the specification, such as diameter, which imply circular section should be construed accordingly.

Suitable materials for both the main heat sink body and the slug include, but are not restricted to, aluminium and copper, and it is to be understood that the slug and heat sink need not be made of the same material (due regard being paid to differential thermal expansion of course).

Although it is of course possible to produce an interference fit between the slug and the sleeve by contracting the latter about the former, there are disadvantages in such an arrangement. Contracting of the sleeve close to where it enters (if it was formed separately) the main heat sink will tend to open a gap between them. While contraction of the sleeve remote from the main heat sink will tend to leave an airgap between the slug and sleeve remote from the point of contraction, resulting in a much lengthened thermal path and increased thermal resistance. With the preferred arrangement, the slug's internal screw serves to urge the slug against the sleeve and the sleeve against the heat sink—the object being to ensure that the thermal path from the slug to the main heat sink is kep short and free from all air gaps.

The present invention was used to provide heat sinking of standard plug in units used in a rack mounted signalling system. The most severe test was provided by circuit boards (222×195 mm) carrying 5 uncommitted logic (or cell) arrays each dissipating 4.0 watts.

Each circuit board is mounted on a heat sink from which it is separated by a small air gap. To ensure good electrical screening, a metal case is placed over the populated side of the circuit board and attached to the heat sink. Together they form a Faraday cage which is independently grounded and locally isolated from the pcb signal earth.

For reliable operation, the junction temperatures of the uncommitted logic arrays had to be kept at not more than 100° C. even when operating at an ambient temperature (in the racks) of 60° C. For each array therefore, the junction to ambient thermal resistance had to be kept at not more than 10° C./Watt. After measuring various single plate heat sinks of dimensions similar to the circuit board (but up to 25 mm thick), a black anodised aluminium type weighing 1.08 kg and providing a thermal resistance to ambient of 0.7° C./W was selected. Since this single heat sink had to serve 5 uncommitted logic arrays, the thermal resistance to ambient per array provided by the selected design approximates to 3.5° C./W. It can therefore be seen that the thermal resistance between the junctions of the arrays and the heat sink had to be limited to no more than 6.5° C./W.

Ceramic chip carriers were selected as offering the lowest junction to case thermal resistance. Various types were tested, and it was determined that provided 100% eutectic back die coverage is maintained a 64 pin leaded ceramic flatpack manufactured by MSI could yield junction to case thermal resistance within 3.0° C./W. Another similar package, but with a thinner (0.015") ceramic base manufactured by Tekform was found to have a junction to case thermal resistance 0.8° C./W less than the MSI type. However it was felt that the latter package might be too fragile for the particular application in question, and hence the former package was used.

It was found that because of the underside flatness tolerance of the MS1 flatpack, simply clamping the component and heat sink pillar together could not be relied upon to provide a reproducible or reliable solution. Further, given the fragility of glass sealed ceramic flatpacks such clamping as a means of achieving low thermal resistance should be avoided. As a consequence of this observation a programme to identify suitable pillar/component interface materials was pursued. It was found that to achieve the target junction/heat sink thermal resistance it was necessary to use silver epoxy (which typically has a thermal conductivity of 7 $Wm^{-1}K^{-1}$ or above). However, where the maximum acceptable resistance is higher, a RTV silicone rubber ($K=2.18$ $Wm^{-1}K^{-1}$) was found to be acceptable. Since the precise requirements of any particular application dictate the maximum acceptable overall thermal resistance, other interface materials (elastomers, adhesives etc.) having slightly lower thermal conductivities may be found suitable. It should be mentioned however, that while the silver epoxy and silicone (which were prepared in situ and applied as a two part paste and viscous fluid respectively) provided good surface contouring and acceptable, clamping independent, thermal resistance, all the other materials which were tried required considerable pressure in order to yield acceptably low thermal resistances (for 1 Watt rather than 4 Watt chips) and even that was achieved with questionable reproducibility.

Figure 4:
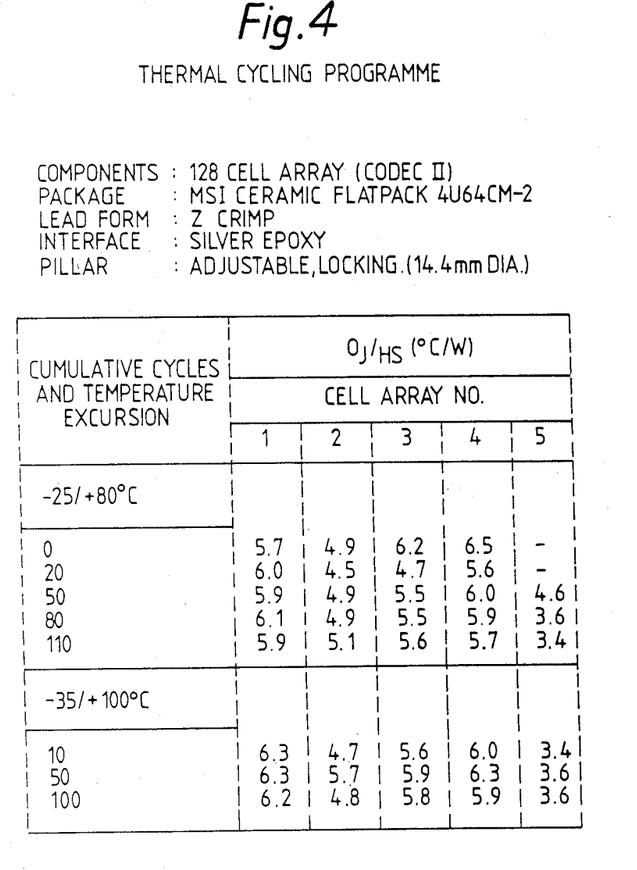
FIG. 4 is a table of a thermal cycling program.

Table A as shown in FIG. 4 gives, for 5 uncommitted logic arrays, figures for the thermal resistance between the semiconductor junctions of the arrays and the heat sink. In order to assess the invention's resistance to differential thermal expansion, the boards were thermally cycled as shown.

Throughout this specification the heat sink has been described in relation to the cooling of integrated circuits mounted in chip carriers, but clearly the invention is equally useable with other devices in other packages.

What is claimed:

1. A heat sinking apparatus for use in conducting heat away from a circuit device, said apparatus comprising:
   a first heat conductive structure having an aperture therein;
   a second heat conductive structure sized to fit and move axially within said aperture and including expansion means for selectively locking the second structure into a tight friction fit at a range of axial positions within the aperture; and
   a third heat conductive structure having one side adapted for thermal contact with said circuit device and an opposite side adapted for thermal contact with an exposed end of said second structure and including fastening means for selectively achieving mechanical and thermal attachment between said second and third structures while yet also permitting selective detachment of the second and third structures.

2. A heat sinking apparatus as in claim 1 wherein said fastening means includes means permitting a predetermined degree of lateral adjustment between said second and third structures before they are mechanically and thermally attached.

3. A heat sinking apparatus as in claim 1 or 2 further comprising:
   a heat sink main body having an aperture in which said first heat conductive structure is frictionally engaged.

4. A plurality of heat sinking apparatuses as in claim 1 or 2 further comprising:
   a heat sink main body having a plurality of apertures in each of which a corresponding said first heat conductive structure is frictionally engaged.

5. A heat sinking apparatus as in claim 1 or 2 in which said fastening means includes means for preventing rotation between said second and third structures.

6. A heat sinking apparatus as in claim 1 or 2 further comprising means for preventing rotation between said first and second structures.

7. A heat sinking apparatus as in claim 1 or 2 wherein said expression means comprises a tapered threaded aperture within said second structure, slots formed within said second structure to facilitate radial expansion and a threaded screw member engaging the threads of said tapered threaded aperture.

8. A heat sinking apparatus as in claim 1 or 2 wherein said fastening means comprises a threaded aperture in said third structure and a matingly treaded screw member passing through an end aperture of said second structure which end aperture is over-sized with respect to said screw member so as to permit lateral adjustments between said second and third structures before the screw member is tightened to fixedly secure the third structure to the second structure.

9. A heat sink for an electronic component, the heat sink comprising:
   a main heat sinking body, and
   a slug of thermally-conductive material slidably received in a hole in the main heat sinking body,
   the slug having a demountable head having a contact face for thermal contact with the component,
   means being provided whereby the clearance between the walls of the slug and the walls of the hole can be reduced to establish an interference fit therebetween to secure the slug in the hole,
   wherein, with said interference fit established, the thermal resistance between the contact face and the main heat sinking body is at most 5° C. per Watt, and
   wherein the heat of the slug is laterally adjustable with respect to the rest of the slug.

10. A heat sink as in claim 9, wherein the means for establishing said interference fit operate by expanding the slug laterally within the hole.

11. A heat sink as in claim 9, wherein the hole is the inner bore of a sleeve which is itself mounted in the main heat sinking body.

12. A heat sink as in claim 11 wherein the sleeve protrudes from the main heat sinking body, the protruding portion of the sleeve being provided with fins.

13. An assembly comprising an electronic component mounted on a substrate, and a heat sink including:
   a main heat sinking body and a slug of thermally-conductive material received within a hole in the main heat sinking body,
   the slug having a demountable head having a contact face, remote from the main heat sinking body, for thermal contact with the component,
   wherein an interference fit exists between the slug and the hole, whereby the slug is retained in the hole,
   wherein the thermal resistance between the contact face and the main heat sinking body is at most 5° C. per Watt, and
   wherein the head of the slug is laterally adjustable with respect to the rest of the slug.

14. An assembly as in claim 13, wherein the heat sink is attached to the substrate, and wherein the contact face end of the slug extends through the substrate.

15. An assembly as in claim 13, wherein heat transfer means are provided to effect low thermal resistance between the component and the contact face.

16. An assembly as in claim 13, further comprising means for establishing said interference fit between the slug and the hole.

17. An assembly as in claim 16, wherein the means for establishing said interference fit operate by expanding the slug laterally within the hole.

18. An assembly comprising:
- a plurality of electronic components mounted on a substrate,
- a heat sink attached to the substrate, the heat sink comprising:
  - a main heat sinking body and a plurality of slugs of thermally-conductive material,
  - each slug being received in a respective hole in the main heat sinking body, and each slug having a demountable head having a contact face, remote from the main heat sinking body, for thermal contact with a respective one of the electronic components,
  - the contact face end of each slug extending through the substrate by an adjustable amount,
  - each slug being lockable in the adjusted position by the establishment of an interference fit between its walls and the respective hole, wherein, with said interference fit established, the thermal resistance between each contact face and the main heat sinking body is at most 5° C. per Watt. and
- wherein the head of each slug is laterally adjustable with respect to the rest of that slug.

19. An assembly as in claim 18, wherein each hole is the inner bore of a sleeve which is itself mounted in the main heat sinking body.

20. An assembly as in claim 19, wherein each sleeve protrudes from the main heat sinking body, the protruding portion of each sleeve being provided with fins.

* * * * *

UNITED STATES PATENT AND TRADEMARK OFFICE
CERTIFICATE OF CORRECTION

PATENT NO. : 4,802,532

DATED : February 7, 1989

INVENTOR(S) : Ronald Dawes, Geoffrey T. Hilton, Anthony W. Marshall and Derek Bullivant It is certified that error appears in the above-identified patent and that said Letters Patent is hereby corrected as shown below:

Column 8, line 13, change "expression" to --expansion--.
Column 8, line 20, change "treaded" to --threaded--.

Signed and Sealed this

Tenth Day of October, 1989

Attest:

DONALD J. QUIGG

Attesting Officer

Commissioner of Patents and Trademarks